United States Patent [19]
Durham et al.

[11] Patent Number: 5,876,897
[45] Date of Patent: Mar. 2, 1999

[54] POSITIVE PHOTORESISTS CONTAINING NOVEL PHOTOACTIVE COMPOUNDS

[75] Inventors: Dana L. Durham, Flemington; Ping-Hung Lu, Bridgewater; Joseph E. Oberlander, Phillipsburg; Dinesh N. Khanna, Flemington, all of N.J.

[73] Assignee: Clariant Finance (BVI) Limited, Virgin Islands (Br.)

[21] Appl. No.: 812,542

[22] Filed: Mar. 7, 1997

[51] Int. Cl.$^6$ .............................. G03F 7/023; G03F 7/30
[52] U.S. Cl. ................ 430/170; 430/192; 430/193; 430/326; 430/330
[58] Field of Search ................ 430/170, 190, 430/192, 193, 326, 330

[56] References Cited

U.S. PATENT DOCUMENTS

| | | | |
|---|---|---|---|
| 2,859,112 | 11/1958 | Sus et al. | 430/192 |
| 3,522,049 | 7/1970 | Poot et al. | 430/192 |
| 3,592,646 | 7/1971 | Holstead et al. | 430/192 |
| 4,284,706 | 8/1981 | Clecak et al. | 430/192 |
| 4,339,522 | 7/1982 | Balanson et al. | 430/192 |
| 4,339,552 | 7/1982 | Lindemann | 524/459 |
| 4,522,911 | 6/1985 | Clecak et al. | 430/193 |
| 4,588,670 | 5/1986 | Kelly et al. | 430/165 |
| 4,601,969 | 7/1986 | Clecak et al. | 430/192 |
| 4,622,283 | 11/1986 | Gray | 430/192 |
| 4,624,908 | 11/1986 | Schwartzkopf | 430/192 |
| 4,626,491 | 12/1986 | Gray | 430/193 |
| 4,735,885 | 4/1988 | Hopf et al. | 430/192 |
| 4,752,551 | 6/1988 | Schwarzkopf | 430/192 |
| 4,853,315 | 8/1989 | McKean et al. | 430/192 |
| 5,171,656 | 12/1992 | Sebald et al. | 430/192 |
| 5,501,936 | 3/1996 | Hosoda et al. | 430/191 |
| 5,532,107 | 7/1996 | Oie et al. | 430/192 |
| 5,541,033 | 7/1996 | Blakeney et al. | 430/192 |

FOREIGN PATENT DOCUMENTS

| | | | |
|---|---|---|---|
| 195986 | 3/1989 | European Pat. Off. | C03F 7/10 |

OTHER PUBLICATIONS

Derwent Abstract, Japanese 3079670, Nippon Kayaku KK, Aug. 23, 1989.
Derwent Abstract, Japanese 2061640, Toshiba KK, Aug. 26, 1988.
"Diazocyclopentadiene" by W. von E. Doering and C.H. DePuy, the Journal of the American Chemical Society, vol. 75, pp. 5955–5957, May 8, 1953.

*Primary Examiner*—John S. Chu
*Attorney, Agent, or Firm*—Sangya Jain

[57] ABSTRACT

A light sensitive positive composition comprising an alkali soluble resin, a novel photoactive compound represented by the structure

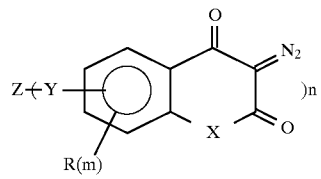

where, X is O, S or N—R', where R' is H, alkyl, substituted alkyl, aryl or aralkyl, Y is a connecting group such as $SO_2$, CO, O or NR', Z is a carbon containing organic ballast moiety having a molecular weight greater than about 75 and can form a bond with the connecting group, R is independently H, alkyl, alkoxy, aryl, aralkyl, halo or fluoroalkyl, m=1–3, and n≧1;

and a solvent or mixture of solvents. The invention further comprises a process for imaging the composition of this invention to give positive image. The light sensitive composition is especially useful as a positive deep-uv photoresist.

19 Claims, No Drawings

POSITIVE PHOTORESISTS CONTAINING NOVEL PHOTOACTIVE COMPOUNDS

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photosensitive compositions are currently used in microlithography to form integrated circuits. As the requirement for faster integrated circuits grows, so does the need to reduce the dimensions of the features printed on these circuits. One method of producing small features is to imagewise irradiate the photoresist with light of shorter wavelengths. The traditional photosensitive compositions which contained novolaks as resins and diazonaphthoquinones as photosensitive compounds worked well at wavelengths between 350 nm and 450 nm. Diazonaphthoquinone photoactive compounds used for irradiation wavelengths between 350 nm and 450 nm are known and described in the following patents, U.S. Pat. No. 4,588,670, U.S. Pat. No. 4,853,315, U.S. Pat. No. 5,501,936, U.S. Pat. No. 5,532,107 and U.S. Pat. No. 5,541,033, which are incorporated herein by reference. However, with light of wavelengths less than 350 nm, and especially less than 250 nm, neither do the typical novolacs have sufficient transparency, nor do the diazonaphthoquinones have the necessary absorption characteristics to allow for photoresist images of adequate resolution and edge acuity to be formed. Therefore, it has become necessary to synthesize new resins and new photoactive compounds for use at shorter wavelengths.

Radiation-sensitive mixtures containing photoactive diazo derivatives which are suitable for irradiation with high-energy deep UV radiation have been described in the literature for some time.

U.S. Pat. No. 4,339,522 discloses positive-working radiation-sensitive mixtures which contain, as a photoactive compound, a diazo derivative of Meldrum's acid. This compound is said to be suitable for exposure to high-energy deep UV radiation in the range between 200 and 300 nm. However, this photoactive compound is lost under the elevated processing temperatures frequently employed in practice; the radiation-sensitive mixture loses its original activity, so that reproducible photoresist images are not obtained.

Further, positive-working photoactive compounds which are sensitive in the deep UV region are disclosed in U.S. Pat. No. 4,735,885. The compounds have the disadvantage that the carbenes formed from these on exposure do not have adequate stability in the matrix for the desired formulation of carboxylic acid. This results in an inadequate solubility difference between the exposed and the unexposed areas in the developer and thus leads to an undesirably high removal rate of the unexposed areas, leading to poor resolution.

U.S. Pat. No. 4,622,283 provide 2-diazocyclohexane-1,3-dione or -cyclopentane-1,3-dione derivatives as photoactive compounds for radiation-sensitive mixtures of the type described. These compounds have lower volatility, but they exhibit, depending on the substitution pattern present, poor compatibility in the radiation-sensitive mixture. This can cause recrystallization in the solution or in the coating.

EP-A 0 195 986 proposes phosphoryl-substituted diazocarbonyl compounds as photoactive compounds, since these have a higher carbene stability. In practice, however, such compounds will probably not be widely accepted since phosphorus atoms are potentially used as dopants for the semiconductor substrates.

Photoactive compounds based on 3, diazo 4, oxo coumarin structure and sensitive in the shorter wavelengths are disclosed in JP 2,061,640. Additionally, JP 3,079,670, describes a photoresist based on a similar coumarin structure, and further includes 2-diazo 1-indanone and 3-diazo 2,4-quinolinedione as photosensitive compounds, wherein the photoresist when processed gives a negative image. These are monomeric diazo compounds that have substituents of low molecular weight, such as methyl, chlorine, methoxy, propyl, that can be susceptible to volatility, diffusion through the photoresist film, amongst other factors. Furthermore, the 3-diazo 2,4-quinolinedione described in JP 3,079,670 discloses as substituents only sulfonic acid, sulfonyl halogeno, alkoxy, hydrogen or halo groups, which in a photoresist, give a negative image.

All of the references mentioned herein are incorporated by reference in their entirety.

The present invention describes a positive photosensitive composition comprising an alkali soluble resin, a novel photoactive compound based on the structure:

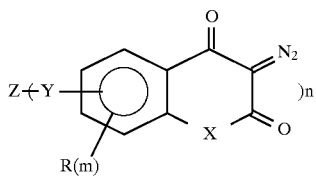

where,
X is O, S or N—R', where R' is H, alkyl, substituted alkyl, aryl or aralkyl,
Y is a connecting group such as $SO_2$, CO, O or NR',
Z is a carbon containing organic ballast moiety having a molecular weight greater than about 75 and can form a bond with the connecting group,
R is independently H, alkyl, alkoxy, aryl, aralkyl, halo or fluoroalkyl,
m=1–3, and n≧1;
and a solvent or mixture of solvents. The novel compound is not a low molecular weight diazo, has high decomposition temperature, good absorption characteristics and unexpectedly when formulated in to a photoresist gives a positive photoresist image.

SUMMARY OF THE INVENTION

The positive photoresist composition of the current invention comprises an alkali-soluble resin, a photoactive compound comprising the structure:

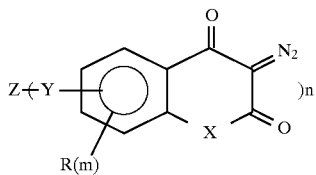

where,
X is O, S or N—R', where R' is H, alkyl, substituted alkyl, aryl or aralkyl,
Y is a connecting group such as $SO_2$, CO, O or NR',
Z is a carbon containing organic ballast moiety having a molecular weight greater than about 75 and can form a bond with the connecting group,
R is independently H, alkyl, alkoxy, aryl, aralkyl, halo or fluoroalkyl,
m=1–3, and n≧1;
and a solvent or a solvent mixture.

The invention further provides for a process of imaging the positive photoresist of this invention, comprising the steps of coating and baking the positive photoresist composition on a substrate, imagewise exposing the film, developing the latent image and optionally baking the photoresist film prior to or after the developing step.

DESCRIPTION OF THE INVENTION

The positive photoresist composition of the current invention comprises an alkali-soluble resin, a novel photoactive compound and a solvent or a solvent mixture. The invention further provides for a process of imaging the positive photoresist of this invention, comprising the steps of coating and baking the positive photoresist composition on a substrate, imagewise exposing the film, developing the latent image and optionally baking the photoresist film prior to or after the developing step.

The present invention is directed towards a novel photoactive compound of the following structure:

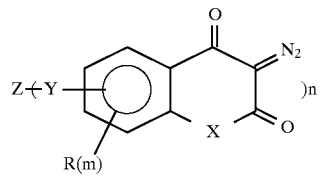

where,
X is O, S or N—R', where R' is H, alkyl, substituted alkyl, aryl or aralkyl,
Y is a connecting group such as $SO_2$, CO, O or NR',
Z is a carbon containing ballast moiety having a molecular weight greater than about 75 and can form a bond with the connecting group,
R is independently H, alkyl, alkoxy, aryl, aralkyl, halo or fluoroalkyl,
m=1–3, and n≧1;

The photoactive compound of this invention is sensitive at short wavelengths, bleaches when irradiated, is stable at high processing temperatures and gives good lithographic properties when processed as a positive photoresist composition.

The heteroatom, X, in the diazo residue of the photoactive compound can be oxygen, sulfur or a nitrogen group. The connecting group, Y, is a reactive functionality that can link the diazo containing residue to the ballast moiety, Z, and furthermore, Y can be represented by groups such as $SO_2$, CO, NR' or oxygen. In one prefered embodiment of the invention, Y is in the 6 position of the diazo residue.

In the above definition and throughout the present specification, alkyl means linear and branched alkyl having the desirable number of carbon atoms and valence. Furthermore, alkyl also includes aliphatic cyclic groups, which may be monocyclic, bicyclic, tricyclic and so on. Suitable linear alkyl groups include methyl, ethyl, propyl, butyl, pentyl, etc.; branched alkyl groups include isopropyl, iso or tert butyl, branched pentyl, hexyl, octyl, etc; monocyclic alkyl groups include cyclopentyl, cyclohexyl and cycloheptyl; bicyclic alkyl groups include substituted bicyclo[2.2.1]heptane, bicyclo[2.2.1]octane, bicyclo [2.2.2]octane, bicyclo [3.2.1]octane, bicyclo [3.2.2]nonane, and bicyclo [3.3.2]decane, and the like. Examples of tricyclic alkyl groups include tricyclo[5.4.0.0.$^{2,9}$]undecane, tricyclo [4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl, alkoxy, hydroxyl, ester or halo groups may have any of the alkyl groups as substituents.

Other alkyl substituents envisioned as being within the scope of this invention are divalent groups such as methylene, 1,1- or 1,2-ethylene, 1,1-, 1,2-, or 1,3 propylene and so on; a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis (methylene)-tricyclo[5.2.1.0.$^{2,6}$]decane.

Aryl substituents include unsubstituted or alkyl, alkoxy, hydroxyl, ester or halo substituted aryl groups, such as, phenyl, tolyl, bisphenyls, trisphenyls, phenylenes, biphenylenes, and others. Fluoroalky groups may be linear or branched and can be represented by trifluoromethyl, 1,1,2-trifluoroethyl, pentafluoroethyl, perfluoropropyl, perfluorobutyl, and 1,1,2,3,3-pentafluorobutyl. Alkoxy substituents can include methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, 2-ethyloctyloxy, phenoxy, tolyloxy, xylyloxy, phenylmethoxy, amongst others.

The ballast moiety of the photoactive compound described in this invention is a compound that is substantially transparent at the irradiation wavelength and is capable of reacting with the diazo containing residue to give a product that is stable in the photoresist composition and coated photoresist film. The appropriate choice of the ballast moiety is critical to properties of the photoactive compound. In particular, when the photoactive compound of this invention is mixed with an appropriate resin and and an appropriate solvent, and coated onto a substrate and processed to give an image, the solubility and stability of the photoactive compound is essential to the final performance of the photoresist. The carbon containing organic ballast moeity Z may be selected from a group consisting of a polymer having an oxygen or nitrogen pendant group, and a ballast group having a formula:

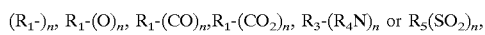

$(R_1\text{-})_n$, $R_1\text{-}(O)_n$, $R_1\text{-}(CO)_n$, $R_1\text{-}(CO_2)_n$, $R_3\text{-}(R_4N)_n$ or $R_5(SO_2)_n$, where where $R_1$ to $R_5$ are independently alkyl having greater than 6 carbon atom, aryl or aralkyl and n is the degree of diazotization.

Ballast compounds that are within the scope of this invention, but not limited to, are hydroxybenzophenones, such as 4,4' dihydroxybenzophenone, 2,3,4 trihydroxybenzophenone, 2,3,4,4' tetrahydroxybenzophenone, etc.; phenolic compounds, such as, bisphenol A, trishydroxyphenylalkanes, phenolic oligomers, polyhydroxyphenylsulphones, pyrogallols, resorcinols, cresols, phenols etc.; aliphatic compounds containing hydroxy and/or amino functionality, such as, 4,8-biscarbonyl-tricyclo[5.2.1.0.$^{2,6}$]decane, polymers containing hydroxy or amino pendant groups, such as poly-4-hydroxystyrene, poly(2-hydroxystyrene 4-hydroxystyrene), copolymers of hydroxystyrene and a member selected from a group consisting of acrylate, methacrylate and mixtuers thereof, poly(hydroxystyrene-co-t-butylcarbonyloxystyrene), poly(hyroxystyrene-co-hydroxymethylstyrene), poly(hyroxystyrene-co-acetoxymethylstyrene), alkyl substituted polyvinylphenols, polymers and copolymers of acrylic acid, vinyl alcohol, maleimide, maleic anhydride etc.

The molecular weight of the ballast moeity is preferably greater than about 75 and preferably containing greater than six carbon atoms, more preferrably greater than about 150, and most preferrably greater than about 175. Generally the value of n, that is, the degree of diazotization of the ballast group, is preferably greater than 1. In a polymer the degree of diazotization can be significantly larger than 1 and is largely dependent on both the solubility of the diazotized polymer in the photoresist solvent and also its lithographic performance. The photoactive component is present in the photoresist composition in an amount sufficient to uniformly photosensitize the photoresist composition. The amount of photoactive compound in the photoresist composition ranges from about 2 weight percent to about 40 weight percent, preferably about 10 weight percent to about 30 weight percent, and more preferably about 15 weight percent to about 25 weight percent of the total solid content of the photoresist composition.

Alkali-soluble resins used in the photoresist composition of the present invention are any of those that form films when coated onto a substrate. Additionally the resins must be of sufficient transparency at the wavelength of imagewise irradiation so as to allow light to reach the bottom of the photoresist film and form good images. Resins that can be used include, but are not limited to, are polyhydroxystyrenes, copolymers of hydroxystyrene and nonaromatic monomers such as acrylates and alcohols, novolaks of high transparency at the irradiation wavelengths, copolymers of styrene and maleimide, polymers and copolymers of maleimide and substituted maleimides, etc. The resins are not envisioned to be limiting to the structure but should satisfy the functional requirements. The resin is present in the photoresist composition in an amount sufficient to form a substantially uniform photoresist composition, where the amount of resin component in the photoresist compound can preferably range from about 60 weight percent to about 98 weight percent, and more preferably from about 70 weight percent to about 90 weight percent and most preferably from about 75 weight percent to about 85 weight percent of the total solid content of the photoresist composition.

Suitable organic solvents for the positive photoresist composition are those that dissolve the solid components of the photoresist and are typically ketones, such as methyl ethyl ketone, cyclohexanone, 2-heptanone, amongst others; esters such as methyl cellosolve acetate, ethyl cellosolve acetate, propylene glycol monomethyl ether acetate, ethyl lactate, ethyl 3-ethoxy propionate, and others; ethers, such as ethylene glycol monomethyl ether, propylene glycol monomethyl ether, anisole and the like. These solvents can be used alone or as mixtures. Additional amounts of other solvents such as esters, alcohols and hydrocarbons may be added.

Other optional ingredients such as colorants, dyes, anti-striation agents, leveling agents, plasticizers, adhesion promoters, speed enhancers, solvents and such surfactants as nonionic surfactants may be added to the solution of resin, photoactive compound and solvent before the solution is coated onto a substrate.

Anti-striation agents may be used at up to a five percent weight level, based on the combined weight of resin and photoactive compound. Plasticizers which may be used include, for example, phosphoric acid tri-(beta-chloroethyl) ester; stearic acid; dicamphor; polypropylene; acetal resins; phenoxy resins; and alkyl resins at one to ten percent weight levels, based on the combined weight of novolak resin and photosensitizer. The plasticizer additives improve the coating properties of the material and enable the application of a film that is smooth and of uniform thickness to the substrate. Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to a 4 percent weight level, based on the combined weight of resin and photoactive compound. The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to 10% weight levels, based on the combined weight of resin and photoactive compound.

The prepared photoresist solution, can be applied to a substrate by any conventional method used in the photoresist art, including dipping, spraying, whirling and spin coating. When spin coating, for example, the photoresist solution can be adjusted with respect to the percentage of solids content in order to provide coating of the desired thickness given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. Additionally, an antireflective coating may be applied to the substrate prior to coating with the photoresist of this invention. The substrate may also comprise various polymeric resins especially transparent polymers such as polyesters. The substrate may have an adhesion promoted layer of a suitable composition such as one containing hexa-alkyl disilazane.

The photoresist composition solution is then coated onto the substrate, and the substrate is temperature treated at from about 80° C. to about 110° C. for from about 30 seconds to about 180 seconds on a hot plate or for from about 15 to about 40 minutes in a convection oven. This temperature treatment is selected in order to reduce the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of a micron in thickness, remains on the substrate. In a preferred embodiment the temperature is conducted at from about 85° C. to about 95° C. The treatment is conducted until the rate of change of solvent removal becomes relatively insignificant. The temperature and time selection depends on the photoresist properties desired by the user as well as equipment used and commercially desired coating times. The coating substrate can then be exposed to actinic radiation, x-ray, electron beam, ion beam or laser radiation, especially ultraviolet radiation, at a wavelength of from about 180 nm to about 350 nm, preferably from about 220 nm to about 260 nm, particularily 248 nm, in any desired pattern, produced by use of suitable masks, negatives, stencils, templates, etc.

The photoresist is then optionally subjected to a post exposure second baking or heat treatment either before or after development. The heating temperatures may range from about 90° C. to about 150° C., more preferably from about 110° C. to about 150° C. The heating may be conducted for from about 10 seconds to about 30 minutes, more preferably from about 45 seconds to about 90 seconds on a hot plate or about 10 to about 30 minutes by convection oven.

The exposed photoresist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. A suitable developer is AZ® MIF Developer available commercially from the AZ® Photoresist Products group of Hoechst Celanese Corporation, Somerville, N.J. After removal of the coated wafers from the developing solution, one may conduct an optional post-development heat treatment or bake to increase the coating's adhesion and chemical photoresistance to etching solutions and other substances. The post-evelopment heat treatment can comprise the oven baking of the coating and substrate below the coating's softening point. The industrial applications, particularly in the manufacture of microcircuitry units on silicon/silicon dioxide-type substrates, the developed substrates may be treated with a buffered, hydrofluoric acid base etching solution. The photoresist compositions of the present invention are photoresistant to acid-base etching solutions and provide effective protection for the unexposed photoresist-coating areas of the substrate. The substrates may also be etched in a gaseous plasma, in which case, the photoresist of this invention provides good plasma resistance.

The following specific examples will provide detailed illustrations of the methods of producing and utilizing the compositions of the present invention. These examples are not intended to limit or restrict the scope of the invention in any way and should not be construed as providing conditions, parameters or values which must be utilized exclusively in order to practice the present invention.

EXAMPLE 1

Synthesis of tosyl azide

In a 250 ml round bottom flask was added 60 ml of deionized (DI) water and 21 g (0.32 mole) of sodium azide. It was mixed at room temperature for 15 minutes until all the sodium azide was in solution. In a 1 liter round bottom flask was added 300 ml of methanol and 50.1 g (0.26 moles) of toluenesulfonyl chloride(tosyl chloride). The solution was mixed at room temperature until all of the tosyl chloride was dissolved. The sodium azide solution was added to the tosyl chloride solution and mixed for 1 hour. The solution darkened and a second phase formed. After the 1 hour hold the reaction was poured into 1200 ml of 20° C. DI water. Two phases formed and the bottom layer was kept. The bottom layer was washed twice with 100 ml of DI water. The yield was 32.4 grams.

EXAMPLE 2

Synthesis of diazotized sulfoquinone (II)

To a 3 necked 1 liter round bottom flask was added 400 ml methanol, 40.7 g (0.16 moles) of 1-methyl-4-hydroxysulfoquinone (I) and 34 g (0.34 moles) of triethylamine. The starting material (I) totally dissolved in the methanol. Tosyl azide 32.4 g (0.16 moles) was added with stirring. The solution was clear in the beginning and turned a pinkish brown color. A precipitate formed. The reaction was stirred for 24 hours at room temperature and the precipitate was filtered off and washed well with 200 ml of methanol. The product was then dried under vacuum at room temperature. The yield was 34 g.

EXAMPLE 3

Synthesis of diazosulfonyl chloride of sulfoquinone (III)

A 3 necked 250 ml round bottom flask was set up with a thermometer and external water bath for either cooling or heating. To the 250 ml round bottom flask was added 50 ml chlorosulfonic acid. Compound II(10 g, 9 0.027 moles) was carefully added to the chlorosulfonic acid while keeping the reaction temperature below 30° C. An external water bath was used for cooling the reaction as needed. The reaction was exothermic. After the addition to the chlorosulfonic acid, the reaction was mixed for 30 minutes at 25°–30° C. After 30 minutes the reaction was warmed to 45°–50° C. Next, 8.1 g (0.063 moles) of thionyl chloride was added slowly to the reaction using a dropping funnel and maintaining the 45°–50° C. temperature. This step was exothermic. The rate of addition of thionyl chloride was controlled both by the temperature and by the foaming/gas evolution. The reaction was held with stirring for 30 minutes at 45°–50° C. after all of the thionyl chloride had been added. Next, the reaction was cooled to 20° C. The cooled reaction product was carefully and slowly added to 300 g of ice in a 1 liter beaker. As the product was added to the icetwater, the product slurry was stirred. The crude Compound III was filtered and washed well with DI water (2 liter) until the pH was 6–7. The product was rinsed with 250 ml of isopropanol and dried under vacuum at room temperature. The yield was 7.9 g.

EXAMPLE 4

Synthesis of diazotized sulfoquinone ester of tris-1, 1,1-(4-hydroxyphenyl) ethane A solution of 2.4 g of 1,4-Diazobicyclo (2,2,2) Octane (Dabco) in 15 ml of gamma butyrolactone (BLO) was prepared in a 50 ml round bottom flask. To a 100 ml 3 neck round bottom flask was added 3.06 (0.01 moles) of 1,1,1-tris-(4-hydroxyphenyl)ethane (THPE), 5.7 g (0.020 moles) of diazo chloride III, and 30 ml of BLO while stirring. The reaction was mixed until all the solid components were dissolved. The Dabco solution was slowly added to the reaction while stirring and keeping the temperature below 30° C. The reaction was stirred for 1 hour at room temperature after the base addition. After the 1 hour hold, 2 ml of glacial acetic acid was added. The reaction was let stand at room temperature for an additional hour. During the 1 hour hold, a 200 ml solution of 10% aqueous methanol was prepared. The aqueous methanol was cooled to 10° C. The reaction was filtered through a Whatman #4 filter. The reaction was then drowned in to the cooled aqueous methanol with stirring. The aqueous methanol was maintained at 10°–15° C. during the drowning step. The product was filtered and washed well with DI water to achieve minimum conductivity. The product was redissolved in 40 ml of acetone and then drowned into 400 ml of 9% concentrated hydrochloric acid at 25° C. The product was filtered and washed well to neutral pH. It was dried at 40° C. under vacuum. The yield was 5 grams.

EXAMPLE 5

Preparation of 3-Diazo-4-oxocoumarin

To a 100 ml round-bottom flask fitted with a mechanical stirrer, nitrogen inlet and bubbler was charged 4-hydroxycoumarin (3.1 g, 18.8 mmol) dissolved in dry terahyrofuran (THF) (21.6 g) and triethylamine (1.8 g). A solution of p-toluenesulfonyl azide (5.3 g, 28.3 mmol) in dry THF (14.4 g) was then added to this solution dropwise over a period of 15 minutes. The reaction was continued until all of 4-hydroxycoumarin had reacted as monitored by high pressure liquid chromatography (HPLC) (ca. 2.0 hours). The precipitated reaction product was filtered in a small Buchner funnel and the filtrate was packed in powdered dry ice to produce a second crop of crystals, which was also isolated by filtration. The combined filtercakes were dried overnight under house vacuum at 60° C. to obtain orange colored crystals of 3-diazo-4-oxocoumarin; yield 2.5 g (70.6% yield). The crude product was further purified by dissolving it in 75.0 g of acetone and precipitating by pouring into 150.0 g ice-water yielding pale yellow crystals.

EXAMPLE 6

Preparation of 6-Chlorosulfonyl-3-diazo-4-oxocoumarin

A 250 ml three-necked round-bottom flask equipped with a magnetic stirrer, water bath, nitrogen inlet and bubbler, thermometer and temperature controller was charged with 3-diazo-4-oxocoumarin (10.1 g, 53.7 mmol) prepared in accordance with Example 5 and chlorosulfonic acid (75.1 g).

The reaction mixture was then heated to 50° C. and maintained at 50° C. for 42 hours, during which time HPLC analysis showed 99% conversion. The reaction was allowed to cool and was poured slowly, in portions, with stirring, into 420 g ice cold ethanol (the temperature of the ethanol slurry was kept below 10° C. throughout the addition). The ethanolic slurry was filtered, and dried in an oven overnight under house vacuum at 58° C. to yield 12.5 g of pure 6chlorosulfonyl-3-diazo-4-oxocoumarin (81 % yield).

EXAMPLE 7

Preparation of Bis(6-sulfonyl-3-azo-4-oxocoumarin) bisphenol A

This Example illustrates the method of attaching ballast groups to the photoactive compounds of the present invention. A 500 ml three-necked, round-bottom flask equipped with a magnetic stirrer, water bath, thermocouple, nitrogen inlet and bubbler was charged with a solution of bisphenol A (3.9 g, 16.9 mmol) in THF (50.0 g). Triethylamine (8.3 g) was then added to this solution dropwise and the reaction mixture was allowed to stir for five minutes. A solution of 6-chlorosulfonyl-3-diazo-4-oxocoumarin (10.078 g, 35.2 mmol; from Example 6) in THF (196 g) was added dropwise and the reaction was allowed to stir at room temperature for about four hours, the reaction mixture was then filtered to remove any insoluble impurities. The filtrate was precipitated in nine times its weight of petroleum ether. The resulting slurry was filtered and the filtercake was dried, overnight at 60° C. under house-vacuum providing 12.5 g pink solids. The crude product was dissolved in 554 g chloroform. The solution was washed with 378 g water and dried over anhydrous magnesium sulfate. The solution was filtered and the filtrate was stirred With 1.8 g of decolorizing charcoal, and was filtered. The product was precipitated by pouring over 2122 g of petroleum ether, filtered, and dried in a vacuum oven, overnight at 60° C.; yield 8.9 g (72.2%).

EXAMPLE 8

Preparation of 1',1',1',-Tris-4-(3-diazo-4-oxo-6-coumarinsulfonyloxyphenyl)ethane Example 7 was substantially repeated in Example 8 with the exception that the type of ballast group and amounts of materials used were as set forth below:

| Materials | Amount |
| --- | --- |
| Tris-4-hydroxyphenylethane (THPE) | 0.7 g (2.3 mmol) |
| 6-Chlorosulfonyl-3-diazo-4-oxocoumarin (from Example 6) | 2 g (7 mmol) |
| Triethylamine | 1.7 g (16.4 mmol) |
| THF | 45 g |

The product was isolated as 2.4 g (97% yield) of pink solids. Recrystallization from chloroform-petroleum ether, then toluene-petroleum ether yielded white crystals.

EXAMPLE 9

Preparation of 4,4'-Bis (3-diazo-4-oxo-6-coumarinsulfonyloxy)benzophenone

Example 7 was substantially repeated in Example 9 with the exception that the type of ballast group and amounts of materials used were as set forth below:

| Materials | Amount |
| --- | --- |
| 4,4'-dihydroxy-benzophenone | 0.7 g (3.4 mmol) |
| 6-Chlorosulfonyl-3-diazo-4-oxocoumarin (from Example 6) | 2 g (7 mmol) |
| Triethylamine | 1.7 g (16.5 mmol) |
| THF | 50 g |

The product was isolated as 1.9 g (78% yield) of pink solids.

EXAMPLE 10

Preparation of 2,3,4,-Tris (3-diazo-4-oxo-6-coumarinsulfonyloxy)benzophenone

Example 7 was substantially repeated in Example 10 with the exception that the type of ballast group and amounts of materials used were as set forth below:

| Materials | Amount |
| --- | --- |
| 2,3,4,-Trihydroxy-benzophenone | 2.1 g (9.2 mmol) |
| 6-Chlorosulfonyl-3-diazo-4-oxocoumarin (from Example 6) | 10.2 g (35.5 mmol) |
| Triethylamine | 8.3 g (82 mmol) |
| THF | 230 g |

The product was isolated as 8.3 g (78% yield) of crystalline product.

EXAMPLE 11

The Example 11 illustrates the preparation of a partially substituted ballast molecule with a photoactive compound. Example 7 was substantially repeated in Example 11 with the exception of modifications in procedure as set forth below. A 1 liter three-necked round-bottom flask equipped with a mechanical stirrer, water bath, thermometer, nitrogen inlet and bubbler was charged with a solution of THPE (8.7 g, 28.4 mmol) in THF (130 g). Triethylamine (20.7 g) was added dropwise and the reaction mixture was allowed to stir for an additional 3-5 minutes. A solution of 6-chlorosulfonyl-3-diazo-4-oxocoumarin (16.3 g, 57 mmol: prepared in accordance with Example 6) in THF (270 g) was added dropwise, and the reaction was allowed to stir at room temperature. After one hour, the reaction mixture was cooled in an ice bath and neutralized by dropwise addition of conc. HCl (16.36 g) while maintaining the temperature of the reaction mixture at about 12° C. The reaction solution was filtered to remove any insoluble impurities. The filtrate was precipitated, with stirring, into five times its weight of hexane (1930 g), filtered and dried in a vacuum oven overnight at 58° C.; yield 21.56 g of yellow solids (97%). The product was taken up in chloroform, washed with water, dried over sodium sulfate, and treated with decolorizing charcoal. Precipitation into petroleum ether provided off-white crystals.

EXAMPLE 12

Preparation of Poly(4-hydroxystyrene)-3-diazo-4-oxocoumarin-6-sulfonate

The Example 12 illustrates the preparation of a partially substituted polymeric product with a photoactive compound. Example 7 was substantially repeated in Example 12 with the exception of modifications in procedure as set forth below. A 500 ml three-necked round-bottom flask equipped with a magnetic stirrer, water bath, thermometer, nitrogen inlet and bubbler was charged with a solution of poly-4-hydroxystyrene (13.3 g, 110 mmol based on monomer repeat units) in THF (170 g). Triethylamine (6.8 g) was added dropwise and the reaction mixture was allowed to stir for an additional 3–5 minutes. A solution of 6-chlorosulfonyl-3-diazo-4-oxocoumarin (1.6 g, 5.6 mmol) in THF (124 g) was added dropwise and the reaction was allowed to stir at room temperature. After one hour, HPLC analysis showed no residual starting material. The reaction mixture was cooled in an ice bath and neutralized by dropwise addition of conc. HCl (8 g) while maintaining the reaction temperature around 12° C. The reaction mixture was filtered to remove any insoluble impurities. The filtrate was precipitated, with stirring, into ten times its weight of hexane. The resulting slurry was filtered, dried in a vacuum oven overnight at 60° C.; yield 11.2 g of white solids (77% yield).

EXAMPLE 13

A resist formulation containing 4.4 weight % of the compound from Example 8, 17.6 wt % poly(4-hydroxystyrene-2-hydroxystyrene), 77.99 wt % propyleneglycol monomethyl etheracetate and 80 ppm FC-430 (available from 3M Corp., St. Paul, Minn.) was prepared and filtered through a 0.5 $\mu$m filter. The resist was spun on several 10.16 cm (4") silicon wafers then baked on a hot plate at 90° C. for 60 seconds to achieve a thickness of about 9000 Å. The wafer was imagewise exposed using a contact printer with a 500 watts deep exposure system (available from the Hybrid Technology Group (HTG), Inc., 2227 Paragon Dr., San Jose, Calif. 95131) and a reticle containing lines/squares pattern region with varied transmittance. The lamp output was measured with a radiometer available from HTG and found to be 1.5 mWatts/cm$^2$ at 254 nm. Typical exposure time was 60–90 seconds. The exposed wafers were baked at 110° C. for 60 seconds and developed with 0.18N tetramethyl ammonium hydroxide (TMAH) aqueous solution for 40–90 seconds by immersion at room temperature. The resist pattern generated on the wafer were evaluated by a Hitachi S-4000 field emission scanning electron microscope. Clear images of the pattern from the reticle were found on the wafer.

EXAMPLE 14

A resist formulation containing 4.4 wt. % of the compound from Example 11, 17.6 wt % poly(4-hydroxystyrene-2-hydroxystyrene), 77.99 wt % propyleneglycol monomethyl etheracetate and 80 ppm FC-430 was prepared and filtered through a 0.5 µm filter. The resist was spun on a 10.16 cm (4") silicon wafer then baked on a vacuumed hot plate at 90° C. for 60 seconds to achieve a thickness of about 9000 Å. The wafer was imagingwise exposed using the same contact printing process described in Example 1. Clear images of the pattern on the reticle was found on the wafer using the imaging process described above.

EXAMPLE 15

A resist formulation containing 4.4 wt. % of the compound from Example 4, 14.95 wt % poly(4-hydroxystyrene-2-hydroxystyrene), 2.65 wt % of a proprietary phenolic compound for increasing photospeed and available from AZ photoresist Products, Hoechst Celanese Corporation, Somerville, N.J., 77.99 wt % of cyclohexanone and 80 ppm KP-341 (a surfactant available from Shin-Etsu, Akron, Ohio) was prepared and filtered through a 0.5 µm filter. The resist was spun on a 10.16 cm (4") silicon wafer then baked on a hot plate at 90° C. for 60 seconds to achieve a thickness of about 9000 Å. The wafer was imagewise exposed using the same contact printing process described in Example 13 except the developer was a 0.13N TMAH aqueous solution. Clear images of the pattern from the reticle were found on the wafer using the imaging process described above.

We claim:

1. A positive photoresist composition comprising an alkali soluble resin; a photoactive compound represented by

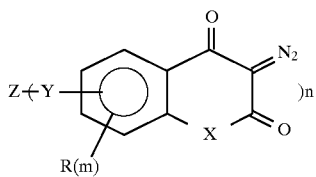

where,

X is O, S or N—R', where R' is H, alkyl, substituted alkyl, aryl or aralkyl,

Y is a connecting group such as $SO_2$, CO, O or NR',

Z is an organic ballast moiety having a molecular weight greater than about 75 and can form a bond with the connecting group, R is independently H, alkyl, alkoxy, aryl, aralkyl, halo or fluoroalkyl, m=1–3, and n≧1;

and a solvent composition.

2. The composition according to claim 1, wherein X is oxygen.

3. The composition according to claim 1, wherein X is oxygen and Y is $SO_2$.

4. The composition according to claim 1, wherein X is N—R' and Y is $SO_2$.

5. The composition according to claim 1, wherein X is oxygen and Y is oxygen.

6. The composition according to claim 1, wherein Y is in the 6 position.

7. The composition according to claim 1, wherein Z is selected from a group consisting of a polymer having an oxygen or nitrogen pendant group, and a ballast group having a formula:

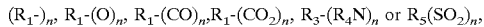

where where $R_1$ to $R_5$ are independently alkyl having greater than 6 carbon atom, aryl or aralkyl and n is the degree of diazotization.

8. The composition according to claim 7, wherein Z-H is selected from a group consisting of trishydroxyphenylethane, bisphenol A, 4,8-biscarbonyltricyclo[5.2.1.0.$^{2,6}$]decane, novolak resin, poly (4-hydroxystyrene), and poly(co-4-hydroxystyrene-2-hydroxystyrene), copolymers of hydroxystyrene and a member selected from a group of acrylates, methacrylates and mixtures thereof, poly(hydroxystyrene-co-t-butyloxycarbonyloxystyrene); poly(hydroxystyrene-co-hydroxymethylstyrene); poly(hydroxystyrene-co-acetoxymethylstyrene); and alkyl substituted polyvinyl phenols.

9. The composition according to claim 1, wherein Z is an organic residue and has greater than about six carbon atoms.

10. The composition according to claim 1, wherein Z has a molecular weight greater than about 150.

11. The composition according to claim 1, wherein Z has a molecular weight greater than about 175.

12. The composition according to claim 1, wherein the alkali soluble resin is selected from a group consisting of novolak resins of high transparency, poly(4-hydroxystyrene), poly(co-4-hydroxystyrene-2-hydroxystyrene), poly(styrene-maleimide), copolymers of hydroxystyrene and a member selected from a group of acrylates, methacrylates and mixtures thereof, poly (hydroxystyrene-co-t-butyloxycarbonyloxystyrene); poly (hydroxystyrene-co-hydroxymethylstyrene); poly (hydroxystyrene-co-acetoxymethylstyrene); and alkyl substituted polyvinyl phenols.

13. The composition according to claim 1, wherein the solvent is selected from a group consisting of propylene glycol mono-alkyl ether, propylene glycol methyl ether acetate, 2-heptanone, anisole, butyl acetate, amyl acetate, ethyl-3-ethoxypropionate, ethyl lactate, ethylene glycol monoethyl ether acetate, and mixtures thereof.

14. The process of imaging a positive photoresist composition comprising the steps of:

a) coating a substrate with the photoresist composition of claim 1;

b) heating the substrate to substantially remove the solvent;

c) imagewise irradiating the photoresist film;

d) developing the irradiated film using an alkali developer;

e) optionally heating the film before or after the developing step.

15. The process of claim 14, wherein the photoresist film is imagewise irradiated using light of wavelength below 350 nm.

16. The process of claim 14, further comprising heating said coated substrate from a temperature of from about 90° C. to about 150° C. for from about 30 seconds to about 180 seconds on a hot plate or from about 15 minutes to about 40 minutes in an oven after the exposure step but before the developing step.

17. The process of claim 14, further comprising heating said coated substrate at a temperature of from about 90° C. to about 150° C. for about 30 seconds to about 180 seconds on a hot plate or for from about 15 minutes to about 40 minutes in an oven after the developing step.

18. The process of claim 14, wherein the alkali developer comprises an aqueous solution of tetramethyl ammonium hydroxide.

19. The process of claim 14, wherein said substrate comprises one or more components selected from the group consisting of silicon, aluminum, polymeric resins, silicon dioxide, doped silicon dioxide, silicon nitride, tantalum, copper and polysilicon.

* * * * *